United States Patent [19]
Saito et al.

[11] Patent Number: 6,032,783
[45] Date of Patent: Mar. 7, 2000

[54] CHIP COMPONENT FEEDING APPARATUS

[75] Inventors: Koji Saito; Taro Yasuda, both of Tokyo, Japan

[73] Assignee: Taiyo Yuden Co., Ltd., Tokyo, Japan

[21] Appl. No.: 08/955,566

[22] Filed: Oct. 22, 1997

[30] Foreign Application Priority Data

Oct. 31, 1996 [JP] Japan ................................. 8-290420

[51] Int. Cl.⁷ ........................ B65G 47/14; B65G 47/252
[52] U.S. Cl. .................... 198/390; 198/396; 198/406; 193/46; 193/44
[58] Field of Search .................. 198/390, 396, 198/406; 193/46, 44

[56] References Cited

U.S. PATENT DOCUMENTS

| | | | |
|---|---|---|---|
| 5,513,739 | 5/1996 | Berg | 198/390 |
| 5,525,023 | 6/1996 | Soga et al. | 198/396 |
| 5,636,725 | 6/1997 | Saito et al. | 198/396 |

FOREIGN PATENT DOCUMENTS 6-232596  8/1994  Japan.

*Primary Examiner*—Christopher P. Ellis
*Assistant Examiner*—Mark A. Deuble
*Attorney, Agent, or Firm*—Lowe Hauptman Gopstein Gilman & Berner

[57] ABSTRACT

A chip component feeding apparatus translates chip components accommodated in bulk along a passage in alignment and feeds the foremost chip component to a predetermined take-out position. A curved passage having at its passage center a predetermined radius of curvature is disposed between the bore of a fixed pipe (vertical passage) and linear passages (transverse passage) used for the transport of components. An opening for the discharge of chip components is provided in the vicinity of the transverse passage of the curved passage.

12 Claims, 13 Drawing Sheets

CHIP COMPONENT FEEDING APPARATUS

BACKGROUND OF THE INVENTION

1. Field of the Invention

The present invention relates to a chip component feeding apparatus in which chip components accommodated in bulk are transported in alignment and the foremost chip component is fed to a predetermined take-out position.

2. Description of the Related Art

Hitherto known as one disclosing such a type of chip component feeder is Japanese Patent Laid-open Pub. No. Hei6-232596.

The chip component feeder disclosed in the publication comprises an accommodation box for accommodating a multiplicity of chip components in bulk, a component take-in tube vertically movably inserted into the bottom surface of the accommodation box, a mechanism for raising and lowering the component take-in tube, a component transport tube extending below in communication with the component take-in tube, a belt arranged at the terminal end of the component transport tube for transporting chip components discharged from the component transport tube to a predetermined direction, a mechanism for intermittently moving the belt at a predetermined pitch, a cover with a passage for aligning the chip components being transported on the belt, and a stopper for stopping the chip components being transported in alignment along the passage.

In this chip component feeder, the component take-in tube is moved up and down to load one by one the chip components within the accommodation box into the component take-in tube in a predetermined orientation, and thus the chip components are discharged onto the belt through the component transport tube and transported in alignment by the belt toward the stopper. After the chip components transported in alignment have been stopped by the stopper, the stopper is displaced forward to separate the stopper from the foremost chip component supplied to the take-out position.

Incidentally, in the chip component feeder described above, the curvature of the component transport tube itself allows the chip components passing through the bore of the component transport tube to change its posture from the longitudinal to the transverse orientation, then the chip components having changed its posture are discharged onto the belt.

However, the chip components to be handled by this type of chip component feeder are small in size and extremely light in weight per each, and therefore it is difficult to ensure the smooth movement of the chip components by use of the above component transport tube, that is, the component transport tube whose bore does not have a certain curvature. In the case of handling chip components having greater dimensions of length in particular, entanglement or clogging may possibly occur among the chip components in motion or at a boundary between the component transport tube and the belt, making it difficult to perform a desired discharge of components without troubles.

SUMMARY OF THE INVENTION

It is an object of the present invention to provide a chip component feeding apparatus ensuring a smooth change in posture of chip components discharged from a vertical passage to a transverse passage, as well as ensuring a smooth discharge action of the chip components onto the transverse passage.

According to an aspect of the present invention, in order to achieve the object, there is provided a chip component feeding apparatus having an accommodation chamber for accommodating a multiplicity of chip components in bulk, a vertical passage through which the chip components are taken in one by one for movement by their own weights, and a transverse passage through which the chip components discharged from the vertical passage are transported in a predetermined direction, the chip component feeding apparatus comprising a curved passage disposed between the vertical passage and the transverse passage for changing the orientation of posture of the chip components discharged from the vertical passage onto the transverse passage so as to conform to the transverse passage; the curved passage having at its passage center a predetermined radius of curvature, the curved passage being provided with an opening for the discharge of chip components in the vicinity of the transverse passage.

The above and other aspects, objects, features and advantages of the present invention will become more apparent from the detailed description with reference to the accompanying drawings.

DESCRIPTION OF THE PREFERRED EMBODIMENTS

Figure 1:
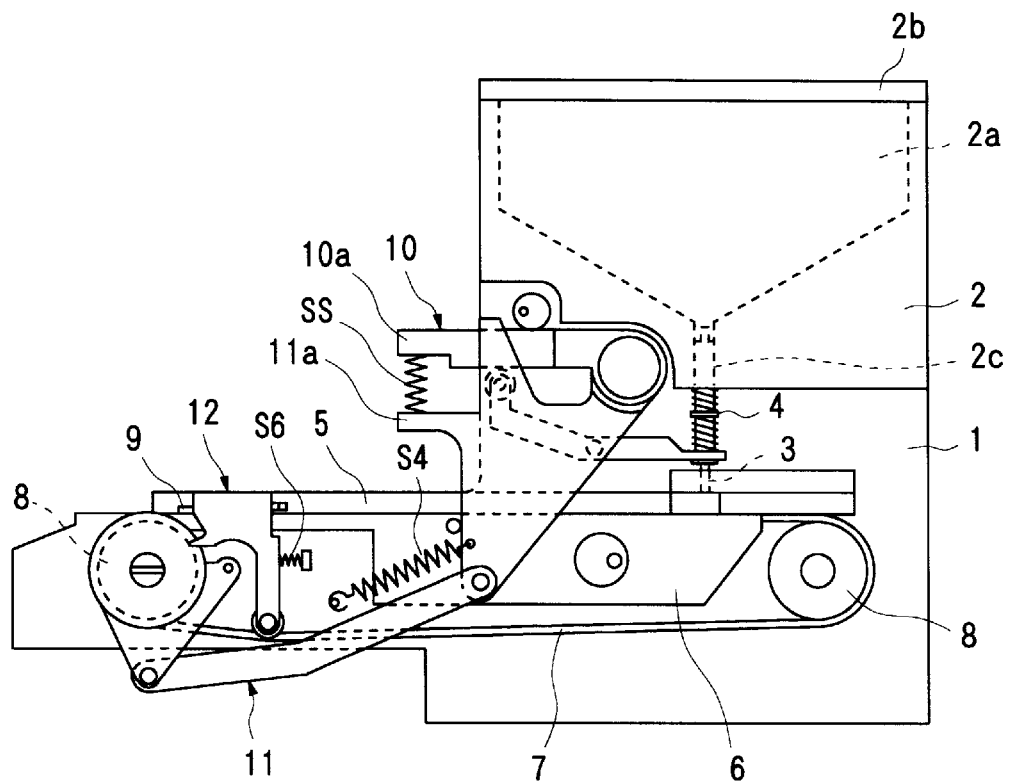
FIG. 1 is a side elevational view of a chip component feeding apparatus showing a preferred embodiment of the present invention.

FIGS. 1 to 16 illustrate a preferred embodiment of the present invention, in which reference numeral 1 denotes a frame, 2 denotes a hopper, 3 denotes a fixed pipe, 4 denotes a movable pipe, 5 denotes a component guide, 6 denotes a belt guide, 7 denotes a belt, 8 denotes a pair of front and rear pulleys, 9 denotes a stopper, 10 denotes a pipe raising/lowering mechanism, 11 denotes a belt delivery mechanism, and 12 denotes a stopper displacement mechanism.

Figure 7:
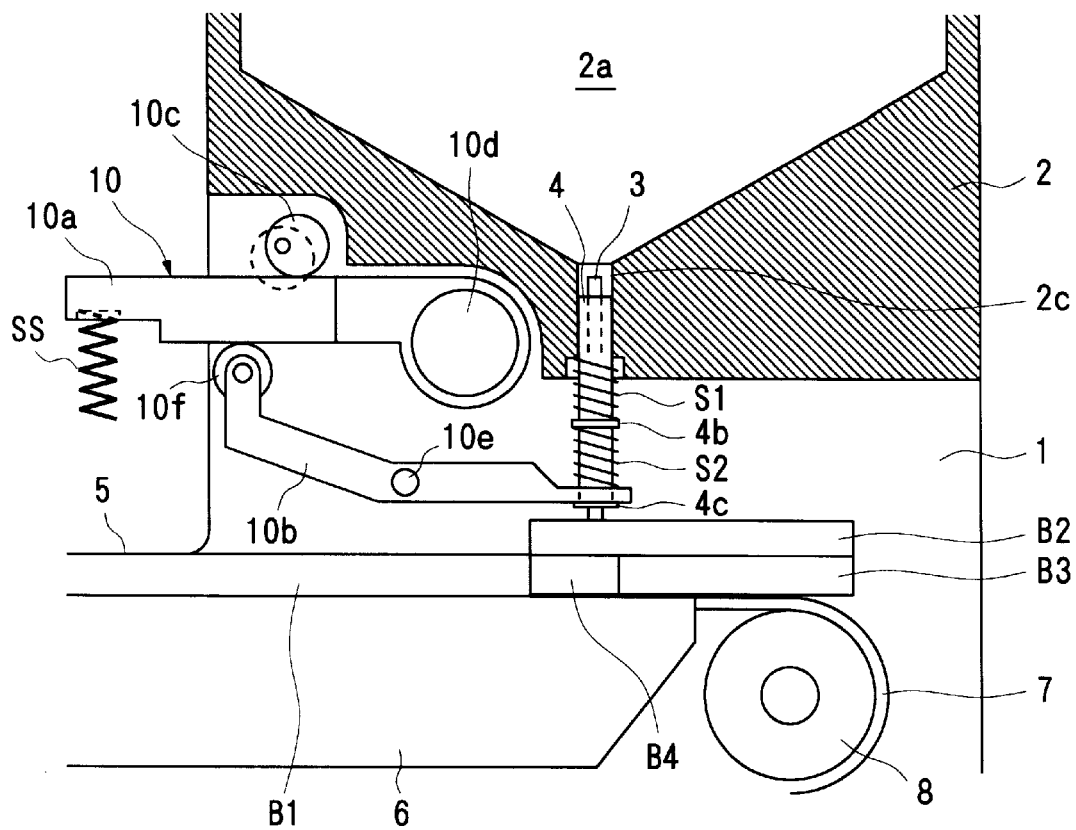
FIG. 7 is a detail view of a pipe raising/lowering mechanism.

The hopper 2 comprises as shown in FIGS. 1 and 7 an accommodation chamber 2a, a cover plate 2b for covering the upper end opening of the accommodation chamber 2a in which the cover plate 2b freely opens and shuts, and a circular sliding hole 2c for the movable pipe which extends through the bottom surface of the accommodation chamber 2a, with the side surface of the hopper 2 being removably mounted on the frame 1.

Within the accommodation chamber 2a there are accommodated in bulk a multiplicity of chip components P having a cylindrical, a prism-like or a flat prism-like shape shown in FIGS. 2(a), 2(b) or 2(c), respectively, for example, a type of chip components represented by chip capacitors, chip inductors, chip resistors, etc. The chip component P has an external electrode and an internal conductor or the like; at least one of the electrode or internal conductor includes at least a portion having high magnetic permeability so the chip component is capable of being attracted by a permanent magnet. The chip components P accommodated in the hopper 2 are moved by their own weight toward the circular sliding hole 2c along an inclined bottom surface with the supply of the components.

As is apparent from FIGS. 3, 5, 7 and 8, the fixed pipe 3 is made of a circular pipe member having a predetermined length and is fixed at its lower end to the component guide 5 and passes centrally vertically through the circular sliding hole 2c with the positional relationship in which its upper end is slightly lower than the upper end of the circular sliding hole 2c. The fixed pipe 3 has a thickness less than the maximum length of the end surface of the chip components P to be fed. The diameter of the bore of the fixed pipe 3 (vertical passage) is slightly larger than the maximum length of the end surface of the chip components P to be fed, allowing the chip components P within the accommodation chamber 2a to be taken one by one into the upper end opening of the fixed pipe 3 with the longitudinal orientation to be moved by their own weight through the interior of the fixed pipe 3 with the same orientation.

Figure 8:
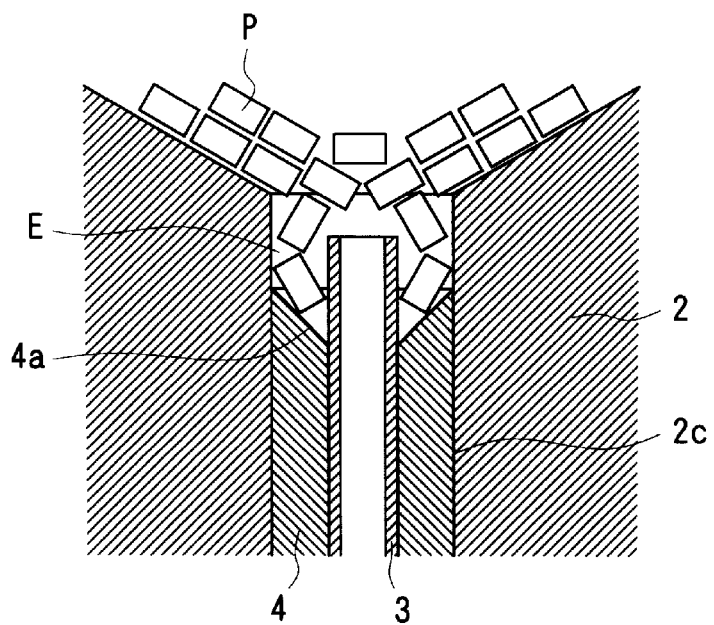
FIG. 8 is a detail view of a movable pipe in its lowered position.

Referring particularly to FIGS. 7 and 8, the movable pipe 4 is made of a circular pipe member having a predetermined length and having an outer diameter slightly smaller than the diameter of the circular sliding hole 2c and an inner diameter slightly larger than the outer diameter of the fixed pipe 3, with a positional relationship in which its upper end is lower than the upper end of the fixed pipe 3, the movable pipe 4 being arranged in a vertically movable manner outside the fixed pipe 3. The movable pipe 4 has a thickness slightly larger than the maximum length of the end surface of the chip components P to be fed and has on its upper end surface a guide surface 4a of a conical shape extending in a downward inclined manner toward its center. The intermediate portion and the lower end portion of the external surface of the movable pipe 4 are formed with engagement collars 4b and 4c, respectively, the intermediate engagement collar 4b having coiled springs S1 and S2 arranged on its top and bottom with a relationship of biasing force expressed by S1<S2.

Figure 3:
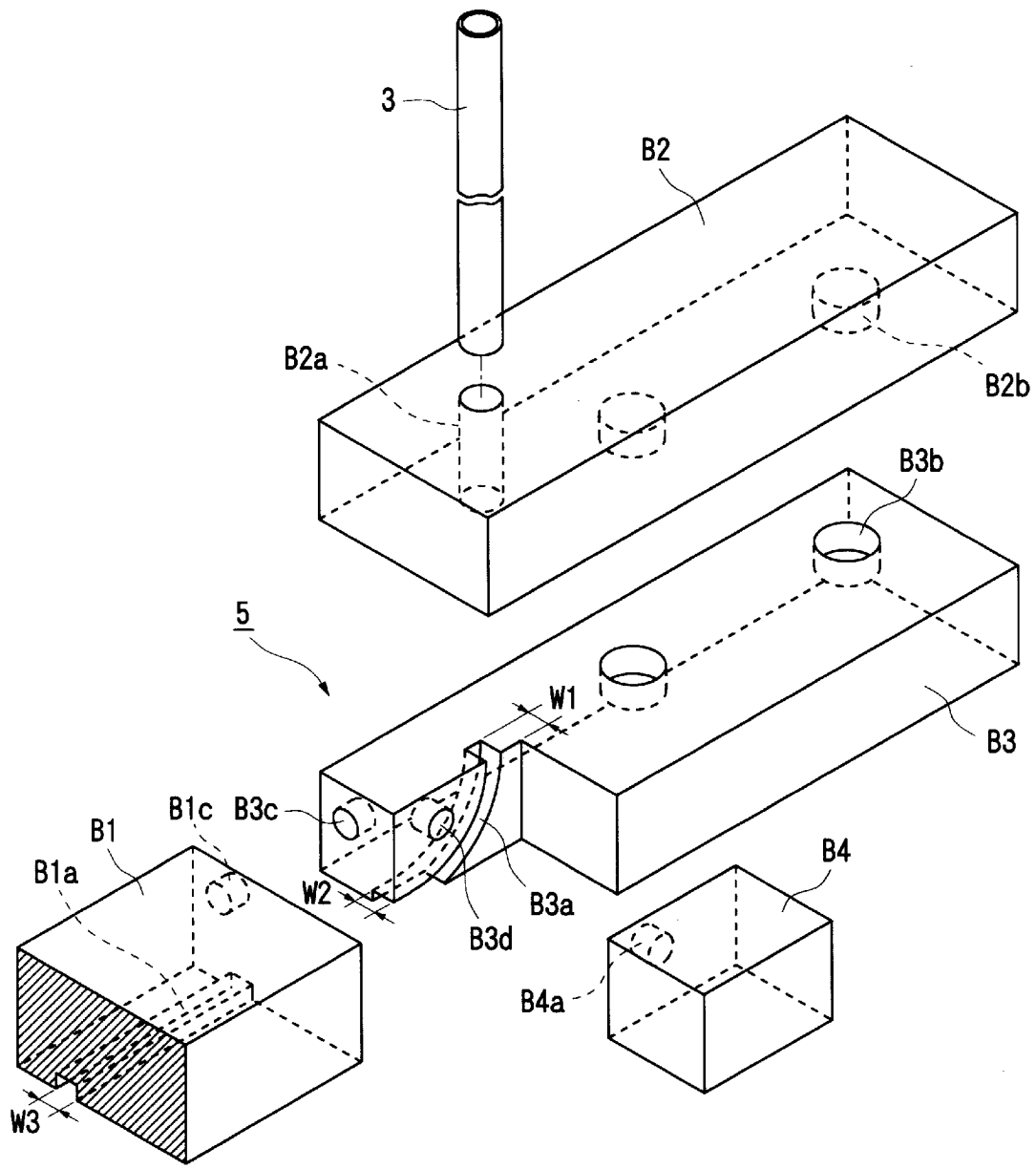
FIG. 3 is a perspective view of a block constituting a component guide.
Figure 4:
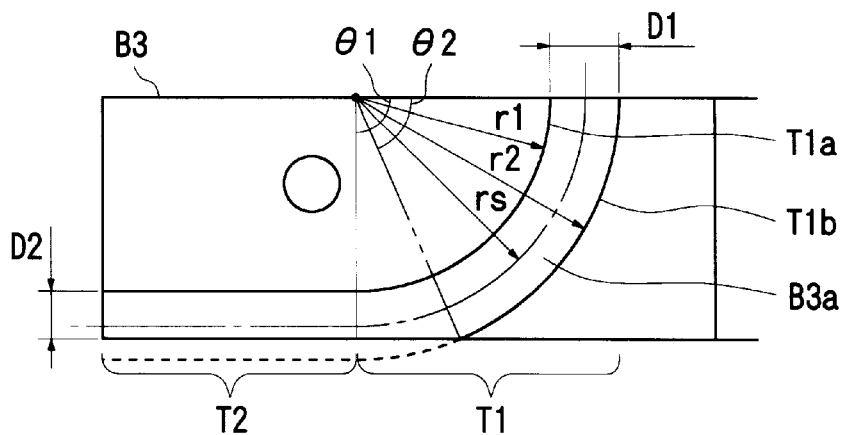
FIG. 4 is a side elevational view of a principal part of a block B3.
Figure 5:
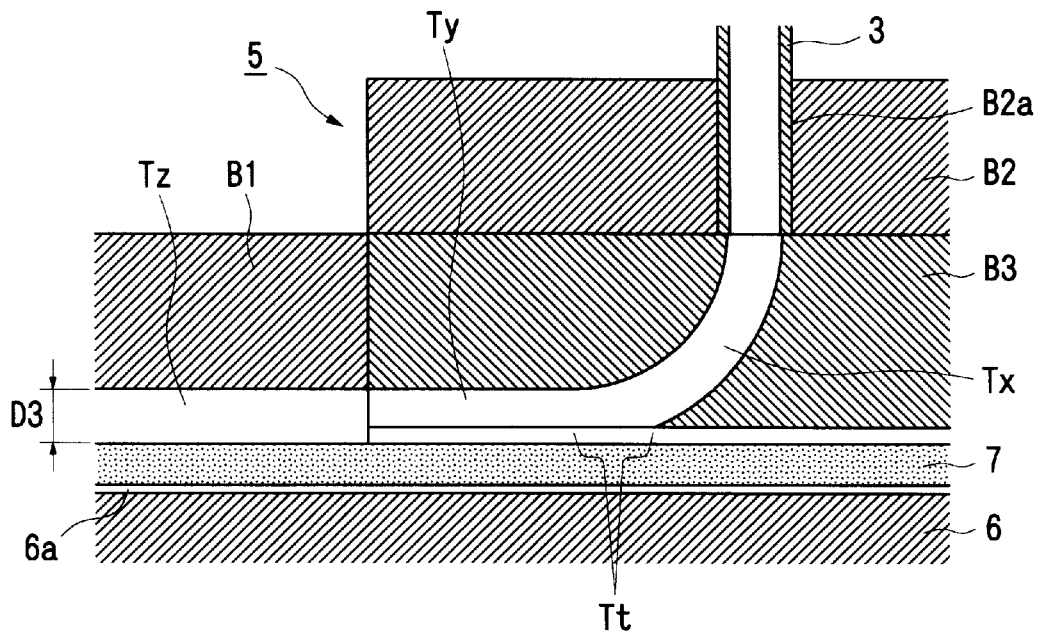
FIG. 5 is a longitudinal sectional view of the component guide.
Figure 6:
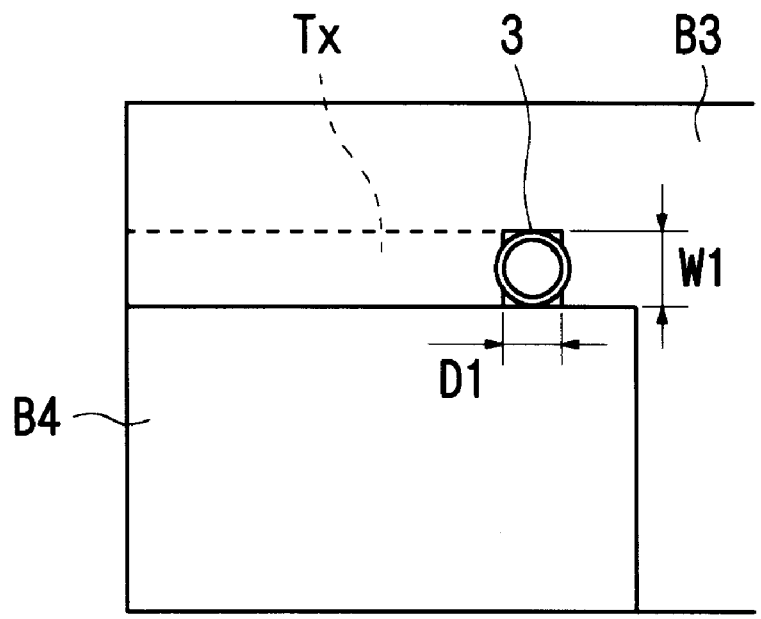
FIGS. 6(a) and 6(b) are top plan views showing the state of connection between a fixed pipe and a curved passage.
Figure 6:
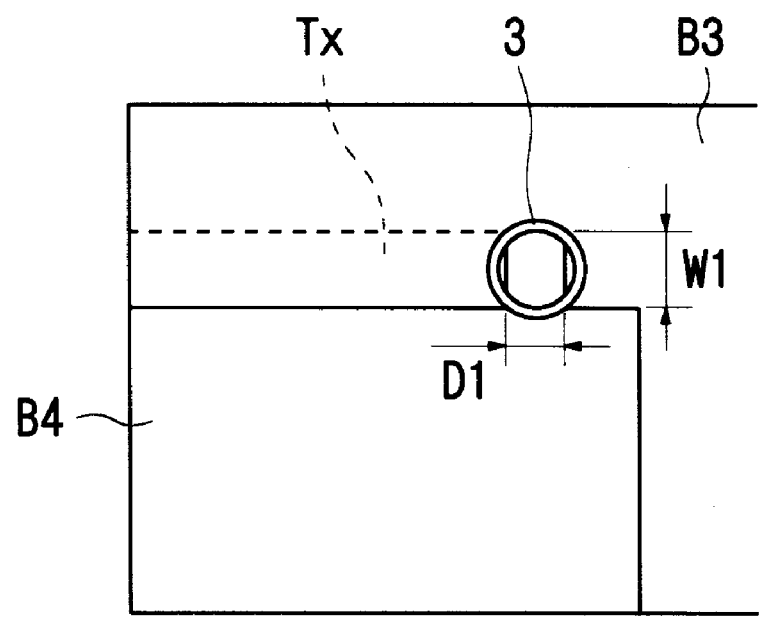

As shown in FIGS. 3 to 5, the component guide 5 consists of four blocks B1 to B4.

The block B1 has in its bottom surface a linear groove B1a having the predetermined width W3 and depth D3 corresponding to the chip components P to be fed. The front part of the block B1 is provided with a component take-out port B1b (see FIG. 15) for allowing the top surface of the foremost chip component P to be exposed to the exterior. The rear part of the block B1 is provided with a protrusion B1c for registering with the block B3.

The block B2 has a through insertion hole B2a for the fixed pipe 3. The bottom surface of the block B2 is provided with two protrusions B2b for registering with the block B3.

The front part of the block B3 is notched on one side, the notched portion having in its inner side surface a groove B3a of a combination in shape of a curved groove and a linear groove. The top surface of the block B3 is provided with two holes B3b corresponding to the protrusion B2b of the block B2. The front part of the block B3 is provided with holes B3c and B3d corresponding respectively to the protrusion B1c of the block B1 and to a protrusion B4a of the block B4.

The block B4 is of the same shape as the notched portion of the block B3. The side surface of the block B4 is provided with the protrusion B4a for registering with the block B3.

As shown in detail in FIG. 4, the groove B3a of the block B3 is of a combination in shape of a curved groove T1 having at its center a predetermined radius of curvature rs and a linear groove T2 continuous with the curved groove T1.

The curved groove T1 comprises a first curved surface T1a having a radius of curvature r1 smaller than the central curvature rs and having the range of angle θ1 of approximately 90 degrees from its upper end, and a second curved surface T1b having a radius of curvature r2 larger than the central curvature rs and having the range of angle θ2 less than 90 degrees from its upper end (θ2=approximately 70 degrees in the drawing), presenting a certain sectional shape (a rectangular shape defined by the width W1 and the depth D1) within the range of angle θ2. Besides, the linear groove T2 has the width W2 equal to that of the curved groove T1 but its depth D2 is smaller than the depth D1 of the curved groove T1. In other words, the groove B3a of the block B3 is so contoured that a plane parallel to the linear groove T2 removes the portions beyond the range of angle θ2 of the curved groove T1 and the lower portion (which is indicated by a dotted line in FIG. 4) of the linear groove T2.

It is to be understood that the width W3 of the linear groove B1a of the block B1 is coincident with the width W1 of the curved groove T1 and with the width W2 of the linear groove T2 and that its depth D3 coincides with the depth D1 of the curved groove T1.

By fitting their respective protrusions into the holes associated therewith, the four blocks B1 to B4 are assembled into the component guide 5, which is fixedly mounted by its side surface to the frame 1. As is apparent from FIG. 5 which is a longitudinal sectional view of its major part, the bottom surface of the block B1 is in contact with the surface of the belt 7 whereas the bottom surfaces of the blocks B3 and B4 do not contact with the surface of the belt 7, forming a gap therebetween corresponding to the difference between the depths D3 and D2.

Thus, the curved groove T1 of the groove B3a of the block B3 is closed at its side opening by the block B4, resulting in a curved passage Tx having a predetermined radius of curvature rs at its passage center and having an opening Tt for the discharge of the chip components in the vicinity of the belt. The linear groove T2 of the groove B3a is closed at its side opening by the block B4 and at its bottom opening by the belt 7, resulting in a linear passage Ty, besides the linear groove B1a of the block B1 is closed at its bottom opening by the belt 7, resulting in a linear passage Tz. As is clear from FIG. 5, the linear passages Ty and Tz are continuous with each other in such a manner that their top surfaces are level with each other, and are become a transverse passage for transporting said chip components in a predetermined direction.

The fixed pipe 3 fitted into the through insertion hole B2a of the block B2 is continuous via its bore with the curved passage Tx in such a manner that its lower end abuts against the top surface of the block B3. FIGS. 6(a) and 6(b) are top plan views showing the state of connection of the fixed pipe 3 with the curved passage Tx. FIG. 6(a) illustrates a case where the diameter of the bore of the fixed pipe 3 is not more than the inlet depth D1 of the curved passage Tx. FIG. 6(b) illustrates a case where the diameter of the bore of the fixed pipe 3 is equal to or more than the inlet depth D1 and not more than the inlet width W1 of the curved passage Tx.

As shown in FIGS. 5, 7, 13 and 15, the belt guide 6 has in its top surface a linear groove 6a of predetermined width and depth corresponding to the belt 7, and being arranged below the component guide 5 in such a manner that the center in the width direction of the linear groove 6a coincides with the centers in the width direction of the linear passages Ty and Tz, besides being fixedly mounted at its side to the frame 1.

As shown in FIGS. 5, 7, 13 and 15, the belt 7 is comprised of a non-magnetic flat belt or a timing belt made of a synthetic rubber or a soft resin. The belt 7 is wound on the pair of pulleys 8 rotatably supported by the frame 1 at the positions anterior and posterior to the belt guide 6, with its upper part being positioned within the linear groove 6a of the belt guide 6 in such a manner that the upper part is brought into movable contact with the bottom surface of the component guide 5 by the winding tension.

Figure 15:
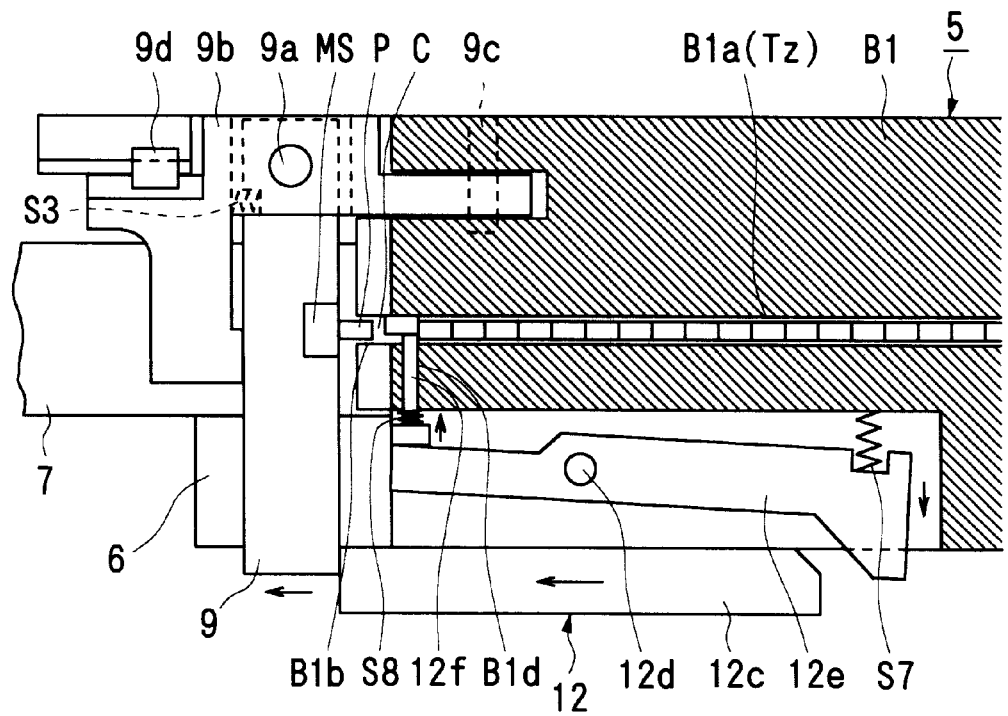
FIG. 15 is a detail view of a stopper displacement mechanism.

As shown in FIG. 15, the stopper 9 is comprised of a non-magnetic rectangular plate having a thickness closer to the depth of the linear passage Tz. At the front position of the linear passage Tz, the stopper 9 is supported at its one end via a pin 9a by a stopper support member 9b in a horizontally movable manner. The stopper 9 is urged by a coiled spring S3 in the counterclockwise direction in FIG. 15, to secure a predetermined component stop position when one surface of the stopper 9 abuts against the front end or its vicinity of the linear passage Tz (See FIG. 16).

At the position confronting the foremost chip component P, the stopper 9 has an attracting section MS comprised of a rectangular parallelepiped rare-earth permanent magnet, which is so oriented that either its north pole or south pole surfaces is allowed to abut against the foremost chip component P. Although in the illustrated example a single permanent magnet comprising the attracting section MS is one having a height substantially equal to the height of the chip component P to be fed and having a width larger than the width of the chip component P to be fed, the permanent magnet may have a height smaller than the height of the chip component P as well as a width less than the width of the chip component P.

It is to be appreciated in the illustrated example that in order to facilitate the discharge of the chip components P residing within the linear passage Tz, the stopper support member 9b for rotatably supporting the stopper 9 is attached at its one end via a pin 9c to the front part of the component guide 5 in an upwardly rotatable manner. More specifically, the stopper 9 is so adapted to be kept horizontally by engaging the front part of the stopper support member 9b with a plate spring 9d disposed on the front end of the component guide 5, and to come apart upward from the belt 7 by releasing the engagement with the plate spring 9d to upward turn the stopper support member 9b. In other words, an upward separation of the stopper 9 from the belt 7 by the upward movement of the stopper support member 9b will allow the chip components P residing within the linear passage Tz to be discharged from the front end of the linear passage Tz to the exterior.

The pipe raising/lowering mechanism 10 comprises as shown in FIG. 7 an operating lever 10a, a relay lever 10b arranged below the operating lever 10a, and a positioning stopper 10c for defining a position to which the operating lever 10a returns. The operating lever 10a is supported at its one end by a pin 10d provided on the frame 1, to allow a rotation in the vertical direction. In its standby mode the intermediate top surface of the operating lever 10a is abutted against the positioning stopper 10c. The relay lever 10b is supported at its central part by a pin 10e disposed on the frame 1, to allow a rotation in the vertical direction. The relay lever 10b has a circular hole portion or a U-shaped portion formed at one end (right end portion in the drawing) and adapted to be disposed between the lower collar 4c of the movable pipe 4 and the lower coiled spring S2. In its standby mode the relay lever 10b is downward biased by the upper coiled spring S1 and the lower coiled spring S2, to bring a roller 10f provided on the other end into abutment against the center bottom surface of the operating lever 10a.

It is to be noted that the positioning stopper 10c is comprised of a disk and a screw for fixing the disk at an eccentric position so as to allow an optional adjustment of the returning position of the operating lever 10a, that is, a lowering position of the movable pipe 4, by varying the orientation of the fixing of the disk. For instance, by displacing the positioning stopper 10c to the position indicated by a dotted line in FIG. 7, the returning position of the operating lever 10a is shifted downward from the position indicated by a solid line, to allow an upward displacement of the lowering position of the movable pipe 4.

Figure 9:
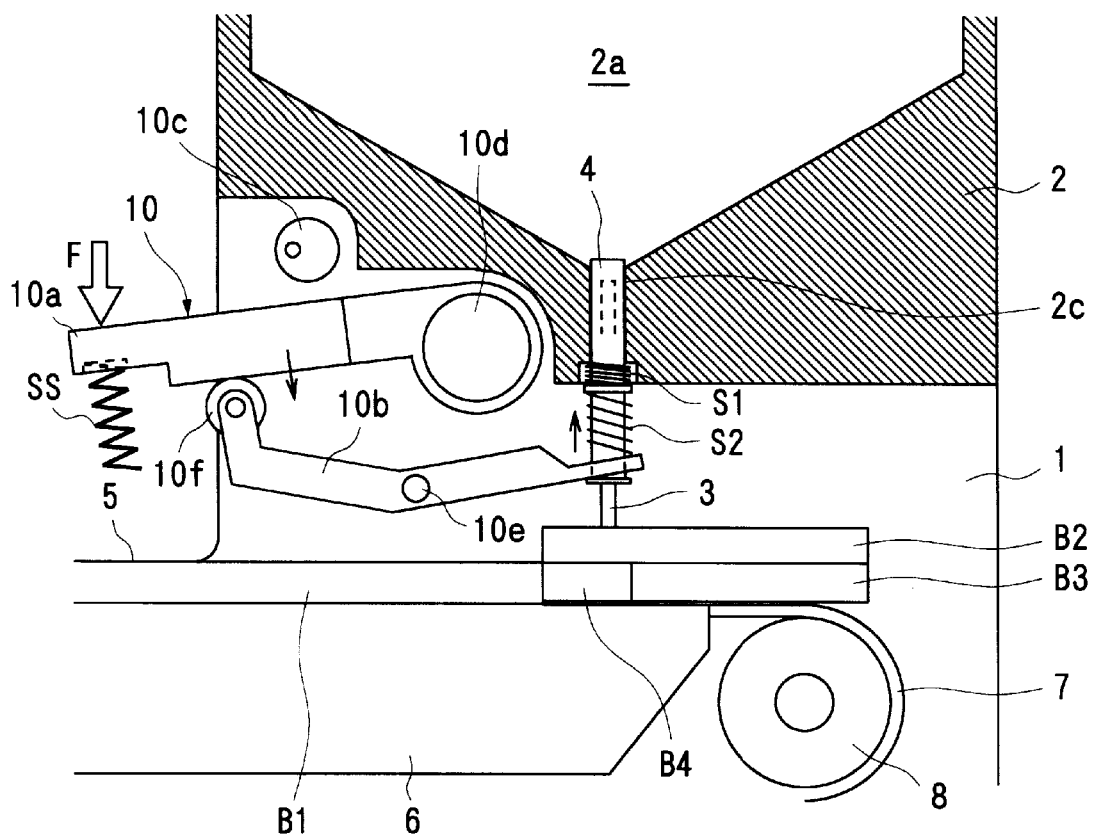
FIG. 9 is an explanatory view of action of the pipe raising/lowering mechanism.

In the pipe raising/lowering mechanism 10, as shown in FIG. 9, the downward pressing force F is applied to the end of the operating lever 10a, to rotate the operating lever 10a around the pin 10d in the counterclockwise direction, to cause the bottom surface of the operating lever 10a to apply the downward force to the roller 10f of the relay lever 10b to rotate the relay lever 10b around the pin 10e in the counterclockwise direction, thereby allowing the upward movement of the movable pipe 4 while compressing the coiled spring S1 via the coiled spring S2 by the end portion of the relay lever 10b.

In the state of FIG. 9, the downward pressing force F applied to the end portion of the operating lever 10a is released to downward move the movable pipe 4 by biasing force of the coiled spring S1, to cause the relay lever 10b to rotate in the clockwise direction, so that push-up motion of the roller 10f will rotate the operating lever 10a in the clockwise direction and the abutment against the positioning stopper 10c will stop the rotation of the operating lever 10a, thus returning to the standby state of FIG. 7.

Figure 11:
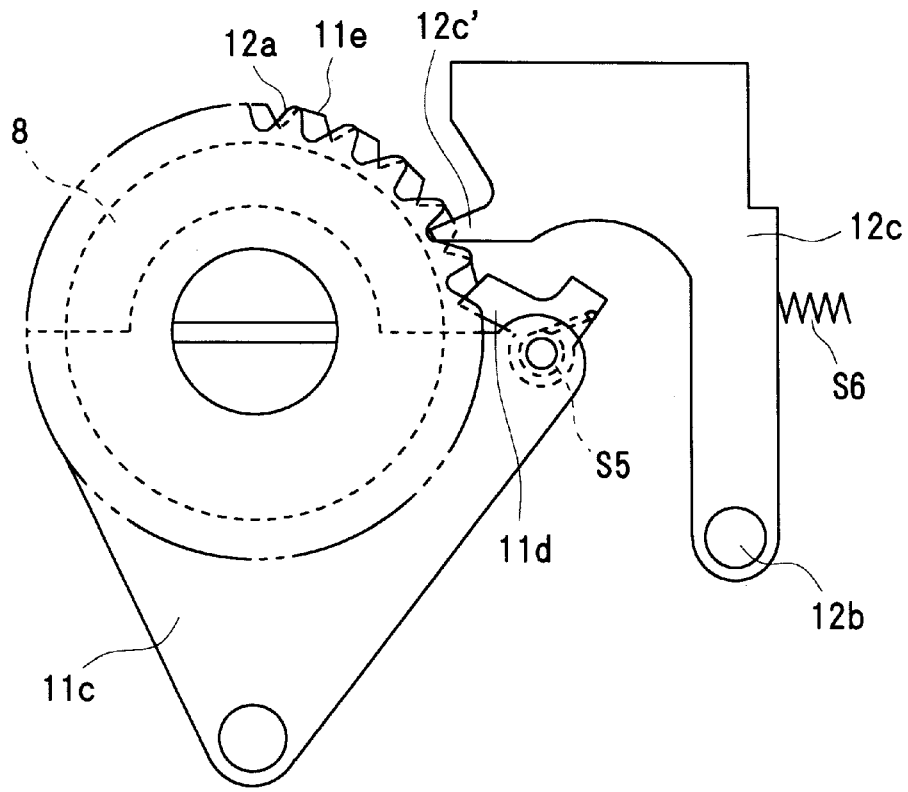
FIG. 11 is a detail view of a front pulley part.
Figure 12:
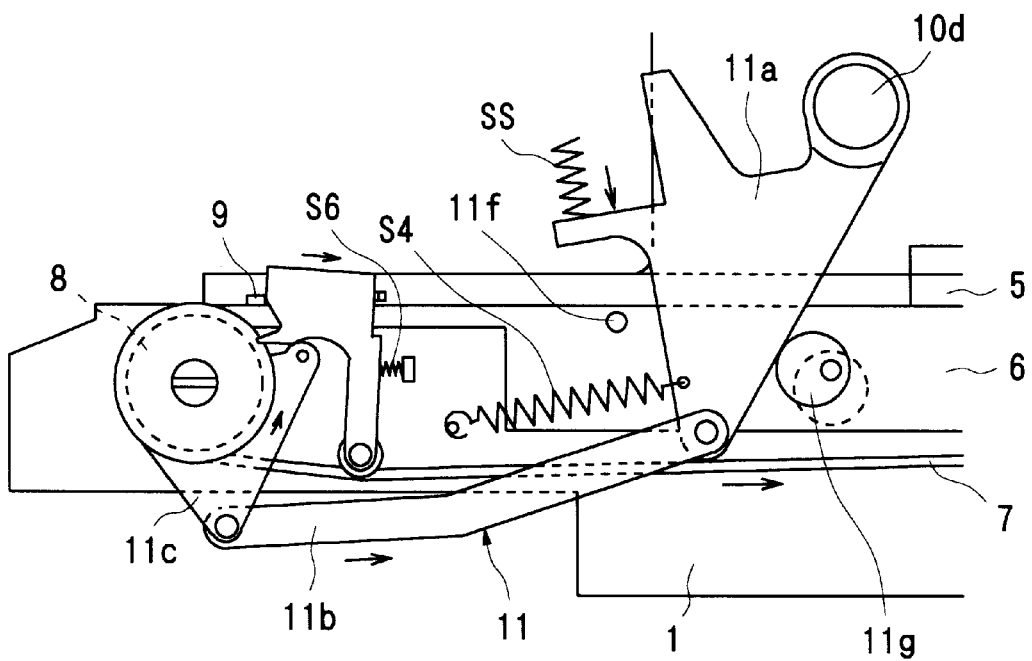
FIG. 12 is an explanatory view of action of a belt delivery mechanism.

The belt delivery mechanism 11 comprises as shown in FIGS. 11 and 12 an operating lever 11a, a relay lever 11b rotatably coupled to the operating lever 11a, a delivery lever 11c rotatably coupled to the relay lever 11b and coaxially rotationally with the front side pulley 8, a pawl 11d rotatably provided on the delivery lever 11c, a ratchet wheel 11e coaxially fastened to the front side pulley 8, a positoining stopper 11f for defining a return position of the operating lever 11a, a positioning stopper 11g for defining a rotation limit position of the operating lever 11a, a coiled spring S4 for biasing the operating lever 11a in the clockwise direction in the drawing, and a coiled spring S5 for bringing the pawl 11d into pressure contact with the ratchet wheel 11e. The operating lever 11a is supported at its one end by the pin 10d common to the pipe raising/lowering mechanism 10 to allow a vertical rotation. In its standby state, the operating lever 11a is abutted at its lever side surface center against the positioning stopper 11f by biasing force of the coiled spring S4.

By way of a coiled spring SS, the operative site of the operating lever 11a of the belt delivery mechanism 11 vertically confronts the operative site of the operating lever 10a of the above-described pipe raising/lowering mechanism 10, thereby enabling the downward pressing force F applied to the end of the operating lever 10a of the pipe raising/lowering mechanism 10 to be transmitted via the coiled spring SS to the end of the operating lever 11a of the belt delivery mechanism 11.

Similar to the positioning stopper 10c described above, the positioning stopper 11g comprises a disk and a screw for fixing the disk at an eccentric position. The disk fixing orientation is varied to arbitrarily adjust the rotation limit position of the operating lever 11a, that is, a delivery amount of the belt 7. For example, a shift of the positioning stopper 11g to the position indicated by a dotted line in FIG. 12 will result in a rightward shift of the rotation limit position of the operating lever 11a from the position indicated by a solid line, thereby increasing the amount of delivery of the belt.

In this belt delivery mechanism 11, the downward pressing force F is applied to the end of the operating lever 10a of the pipe raising/lowering mechanism 10 to transmit this force via the coiled spring SS to the end of the operating lever 11a, thereby as shown in FIG. 12 enabling the operating lever 11a to rotate around the pin 10d against biasing force of the coiled spring S4 in the counterclockwise direction and enabling the delivery lever 11c to rotate via the relay lever 11b in the counterclockwise direction, to consequently cause the ratchet wheel 11e engaging with the pawl 11d of the delivery lever 11c to rotate together with the front side pulley 8 in the counterclockwise direction, allowing forward movement of the belt 7 by a distance corresponding to the rotational angle.

By releasing in the state of FIG. 12, the pressing force F applied to the end of the operating lever 10a of the pipe raising/lowering mechanism 10, the pressing against the end of the operating lever 11a is released to cause a clockwise rotation of the operating lever 11a by biasing force of the coiled spring S4, whereby upon the abutment against the positioning stopper 11f the rotation of the operating lever 11a is stopped to allow the relay lever 11b and the delivery lever 11c to return to the standby state of FIG. 1, with the clockwise movement of the pawl 11d of the delivery lever 11c to the adjacent groove for engagement.

The stopper displacement mechanism 12 comprises as shown in FIGS. 11 and 15 a ratchet wheel 12a coaxially mounted to the front side pulley 8, a stopper actuating plate 12c rotatably attached via a pin 12b to the side surface of the frame 1, a coiled spring S6 for forward biasing the stopper actuating plate 12c to bring its protrusion 12c' into pressure contact with the ratchet wheel 12a, a component retainer lever 12e horizontally movably attached to front part of the component guide 5 by a pin 12d, a coiled spring S7 for biasing the component retainer lever 12e in the clockwise direction in the drawing, a component retainer pin 12f which is inserted into a hole B1d formed in the front part side surface of the linear passage Tz, and a coiled spring S8 for outwardly biasing the component retainer pin 12f.

In the standby state in which the stopper actuating plate 12c is located at its forward position, as shown in FIG. 15, the component retainer lever 12e is biased by the coiled spring S7 in the clockwise direction in the drawing, thereby forcing the component retainer pin 12f against biasing force of the coiled spring S8 into the linear passage Tz so that the second foremost chip component P is pressed by the component retainer pin 12f against the inner surface of the linear passage Tz for retaining at the same position. The pressing of the stopper actuating plate 12c displaces the stopper 9 forward (the component take-out position apart forward from the component stop position) to allow the foremost chip component P to be forward displaced together with the stopper 9 to which the foremost chip component P adheres by the attracting force of the attracting section MS, thus separating them from the succeeding chip components P.

Figure 16:
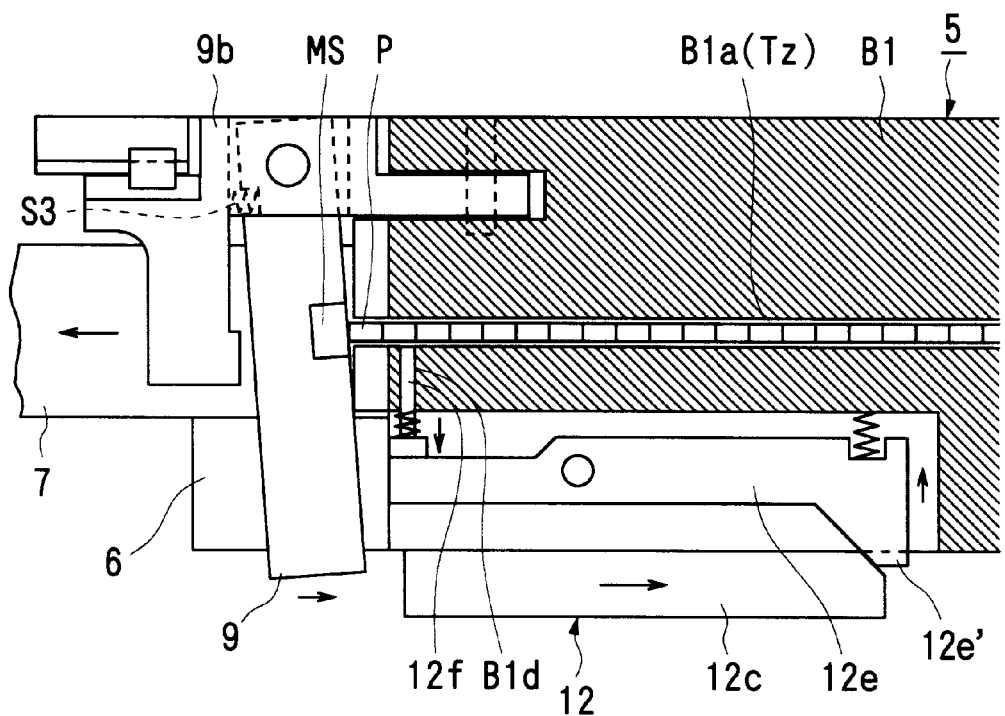
FIG. 16 is an explanatory view of action of the stopper displacement mechanism.

Through a process in which the ratchet wheel 12a rotates together with the ratchet wheel 11e of the belt delivery mechanism 11 described above (that is, the process in which the belt 7 moves forward by a predetermined distance), the stopper displacement mechanism 12 allow the stopper actuating plate 12c to be moved backward by a predetermined distance by making use of the undulation of one ratchet of the ratchet wheel 12a. Upon the rearward movement of the stopper actuating plate 12c, as shown in FIG. 16, the stopper 9 is abutted by biasing force of the coiled spring S3 against the front end of the linear passage Tz to secure the component stop position. Simultaneously with this, a rear end protrusion 12e' of the component retainer lever 12e is forced by the stopper actuating place 12c inward against biasing force of the coiled spring S7 to rotate in the counterclockwise direction in the drawing, so that the component retainer pin 12f moves outward by biasing force of the coiled spring S8, to release the retaining of the second foremost chip component P, thus allowing an aligned transport of the chip components P within the linear passage Tz.

Description will now be given to the action of the chip component feeding apparatus shown in FIGS. 1 to 16.

When the foremost chip component P is taken out of the component take-out port B1b by means of an attracting nozzle (not shown) or the like, the end of the operating lever 10a of the pipe raising/lowering mechanism 10 is pressed downward by part of the attracting nozzle or the like or other driving device.

With the movable pipe 4 at its lowered position, as shown in FIG. 8, there is formed an annular pocket E among the upper end of the movable pipe 4 and the inner surface of the circular sliding hole 2c and the outer surface of the fixed pipe 3, the annular pocket E receiving few components P.

Upon a downward pressing against the end of the operating lever 10a of the pipe raising/lowering mechanism 10, as described earlier, the rotation of the operating lever 10a and the relay lever 10b will result in a raise of the movable pipe 4 by a predetermined stroke from its lowered position, allowing its upper end to enter the accommodation chamber 2a of the hopper 2.

Figure 10:
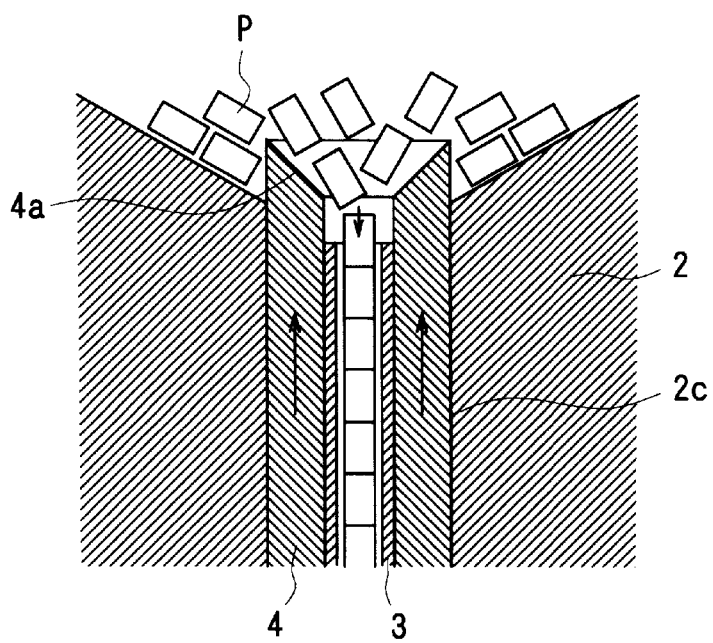
FIG. 10 is a detail view of the movable pipe in its raised position.

In the process in which the movable pipe 4 is moved from its lowered position to the raised position, as show in FIG. 10, the component P within the annular pocket E is upward moved by the movable pipe 4 to release the accommodated components within the accommodation chamber 2a, and the chip components P resting on the fixed pipe 3, if any, could be thrust aside therefrom. In that process, the accommodated components P within the hopper 2 is taken one by one into the upper end opening of the fixed pipe 3 in the longitudinal direction by utilizing the inclination of the upper end guide surface 4a of the movable pipe 4. The chip components P taken into the fixed pipe 3 are moved by their own weights within the fixed pipe 3 with the same orientation.

When the pressing force against the end of the operating lever 10a of the pipe raising/lowering mechanism 10 is released, as described above, the relay lever 10b and the operating lever 10a are rotationally returned by the spring biasing force, simultaneously allowing a downward return of the movable pipe 4 from its raised position by the spring biasing force.

In the process in which the movable pipe 4 is moved from its raised position to its lowered position, as shown in FIG. 8, a small number of components P again enter the annular pocket E and the whole accommodated components move downward. This process also makes use of the inclination of the upper end guide surface 4a of the movable pipe 4 to take the accommodated components P one by one into the upper end opening of the fixed pipe 3 with the longitudinal orientation and to move them by their own weights within the fixed pipe 3 with the same orientation.

Figure 13:
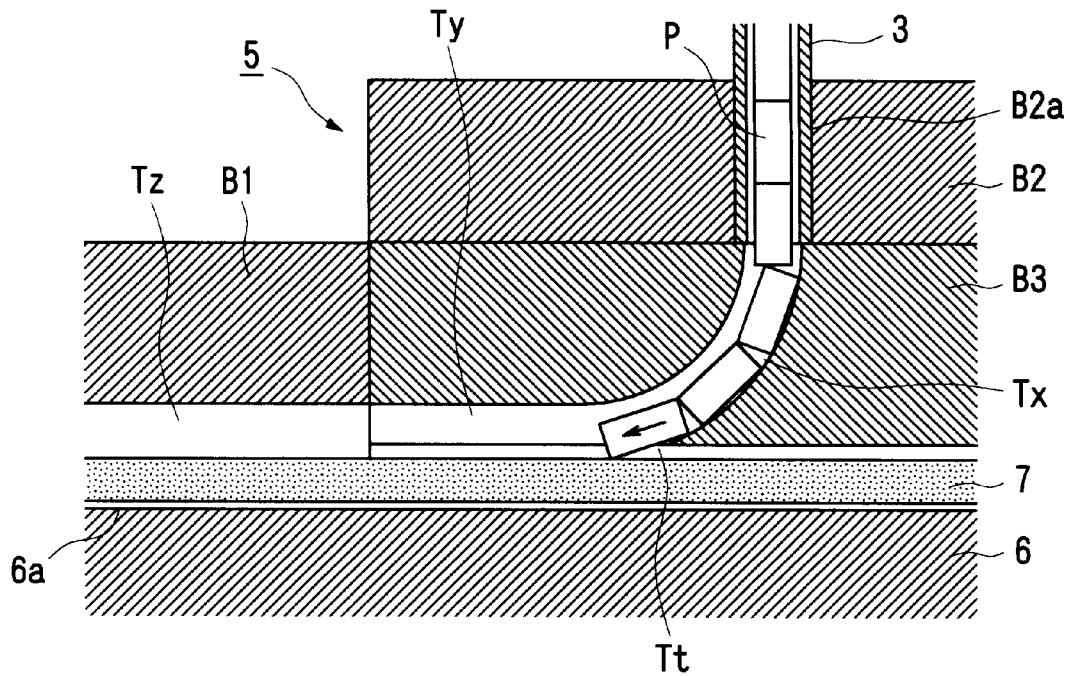
FIG. 13 illustrates the action of discharge of components onto the belt.

The take-in operation of the components into fixed pipe 3 is performed both in the raising process and the lowering process of the movable pipe 4 in this manner, and the chip components P taken one by one into the fixed pipe 3 with the longitudinal orientation as shown in FIGS. 10 and 13 are moved by their own weights through the bore of the fixed pipe 3 and enter the downstream curved passage Tx with the same orientation. When the components to be fed are prism shaped or flat prism shaped as shown in FIGS. 2(a) and 2(b), the chip components P enter the curved passage Tx with the orientation (that is, the orientation in the rotational direction around the vertical axis) matching the contour of the inlet of the curved passage Tx.

In the process of the smooth movement by their own weights through the curved passage Tx in accordance with its radius of curvature, as shown in FIG. 13, the posture of the chip components P which have entered the curved passage Tx is varied from the vertical orientation to the transverse orientation (about 75 degrees in the drawings). After the change of the posture, the chip components P are discharged onto the belt 7 with the same orientation from the opening Tt disposed on the extremity at the lower part of the curved passage Tx, to abut their tips against the surface of the belt 7.

On the contrary, when the downward force is applied to the end of the operating lever 10a of the pipe raising/lowering mechanism 10, as described above, the end of the operating lever 11a of the belt delivery mechanism 11 is also downward pressed by way of the coiled spring SS and the rotations of the relay lever 11b and the delivery lever 11c will result in a counterclockwise rotation of the ratchet wheel 11e engaged by the pawl 11d together with the front side pulley 8, allowing forward movement by a distance corresponding to this rotational angle, preferably by a distance slightly greater than the longitudinal dimensions of the chip components P.

Figure 14:
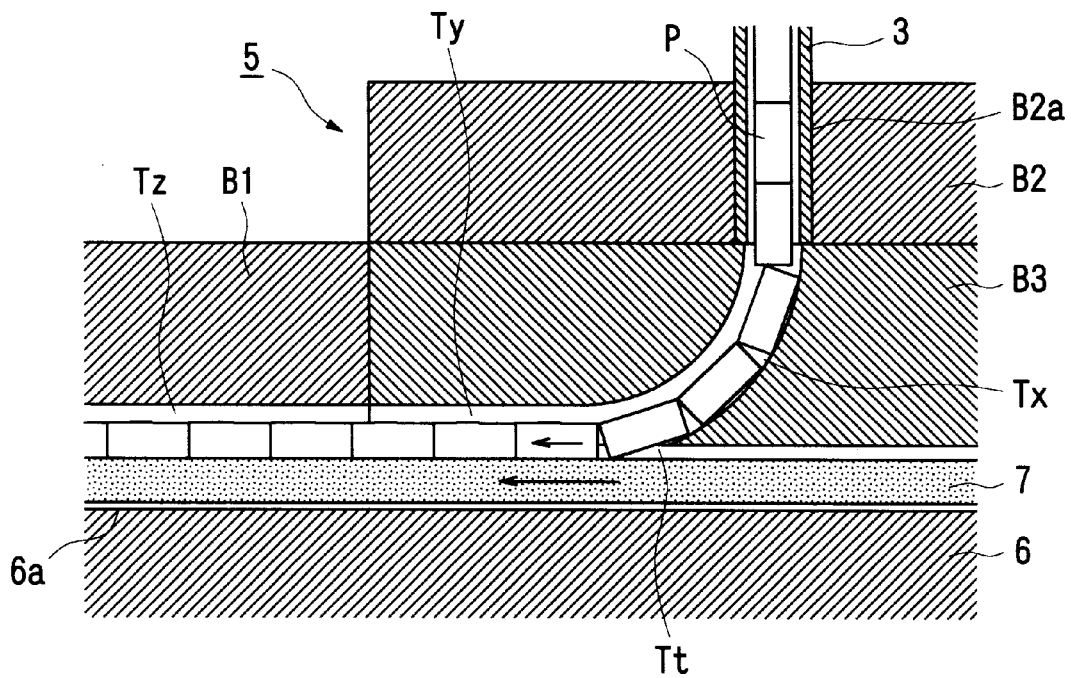
FIG. 14 illustrates the action of discharge of components onto the belt.

In the process of forward moving of the belt 7 by a predetermined distance, as shown in FIG. 14, the chip components P which have been moved by their own weights through the curved passage Tx to abut their tips against the surface of the belt 7, are drawn forward by the frictional resistance with the belt 7 and are entirely turned sidewise to 11e down on the belt 7, to allow the succeeding chip components P to abut their tips against the surface of the belt 7.

Since this intermittent movement of the belt 7 is repeated each time the foremost chip component P is taken out of the component take-out port B1b, the chip components P being stacked within the bore of the fixed pipe 3 and the curved passage Tx are discharged in sequence onto the belt 7 under the posture changing action similar to the above. Simultaneously with this, a plurality of chip components P are aligned with the longitudinal orientation within the linear passages Ty and Tz under the aligning action, and are forward transmitted in response to the intermittent movement of the belt 7 with this aligned state.

On the contrary, when the ratchet wheel 11e of the belt delivery mechanism 11 is rotated together with the front side pulley 8 to move the belt 7 forward, the stopper actuating plate 12c is retreated by a predetermined distance by the ratchet wheel 12a of the stopper displacement mechanism 12 rotating in the same direction, whereupon the spring biasing force causes a backward displacement of the stopper 9, allowing the stopper 9 to abut against the front end of the linear passage Tz to secure the desired component stop position. More specifically, the chip components P transported in alignment during the belt movement are stopped by the abutment against the stopper 9 and are aligned without gaps therebetween with the longitudinal orientation in the state where the foremost chip components P abuts against the stopper 9.

Since the intermittent movement of the belt 7 is so preset as to be slightly larger than the longitudinal dimension of the chip components P, only the belt 7 is allowed to slightly advance with the aid of the sliding action relative to the component contact surface even after the stopper 9 has brought the chip component P transported in alignment to a rest (see FIG. 16).

After the rotation through a predetermined angle (corresponding to one ratchet) of the ratchet wheel 12a of the stopper displacement mechanism 12 together with the ratchet wheel 11e of the belt delivery mechanism 11, as described above, the stopper actuating plate 12c is rotationally returned so that as shown in FIG. 15 the rotational return of the component retainer lever 12e will allow the tip of the component retainer pin 12f to project into the linear passage Tz to retain the second foremost chip components P. Simultaneously with this, the stopper 9 is forward displaced and separated from the front end of the linear passage Tz, and the foremost chip component adhered to the stopper 9 by the magnetic force of the attracting section Ms is moved to the component take-out position together with the stopper 9 to come apart from the succeeding chip components P, to compulsorily form a gap C between the foremost chip component P and the succeeding chip components P.

The take-out action of the foremost chip component P by the attracting nozzle or the like is carried out as shown in FIG. 15 in the state where the foremost chip component P is displaced to the component take-out position together with the stopper 9 and is separated from the succeeding chip components P. For this reason, adhesion and entanglement between the foremost chip component P and the succeeding chip components P due to the influence of humidity or the like would be easily canceled to ensure a take-out with a stabilized posture without any interference between the foremost chip component P and the succeeding chip components P.

In the chip component feeding apparatus shown in FIGS. 1 to 16 in this manner, the curved passage Tx having at its passage center a predetermined radius of curvature rs is provided between the bore (vertical passage) of the fixed pipe 3 and the linear passages Ty and Tz (transverse passage) for use in the transport of components, thereby ensuring the smooth movement of the components through the curved passage Tx with its improved posture change, even in the case of handling chip components of small in size and extremely light-weight per each.

The provision of the opening Tt for the discharge of the chip components in the vicinity of the transverse passage of the curved passage Tx would achieve a smooth discharge action of the chip components P from the curved passage Tx to the transverse passage, thus ensuring an improved desired component discharge even in the case of handling chip components having greater lengths.

Moreover, the opening Tt for the discharge of the chip components is formed by setting to be smaller than 90 degrees the angular range θ2 relative to its upper end, of the curved surface (second curved surface T1b) constituting the curved passage Tx, so that the discharge action of the chip components P onto the transverse passage can be maintained properly by adjusting the angular range θ2 in response to the sizes of the chip components to be fed.

Figure 2:
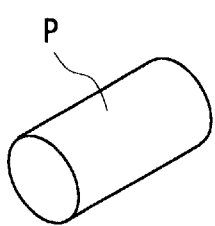
FIGS. 2(a) to 2(c) are perspective views of chip components to be fed.
Figure 2:
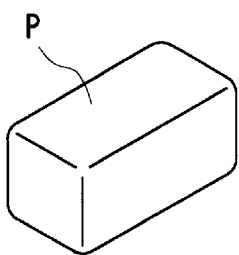
Figure 2:
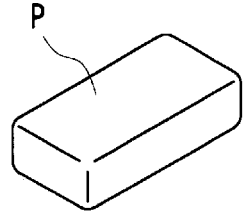
Figure 17:
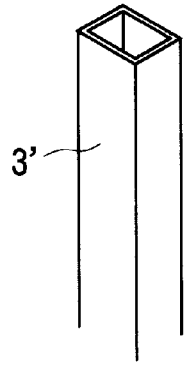
FIGS. 17(a) and 17(b) are a perspective view of a variant of the fixed pipe and a top plan view showing the state of connection between the fixed pipe and the curved passage, respectively.
Figure 17:
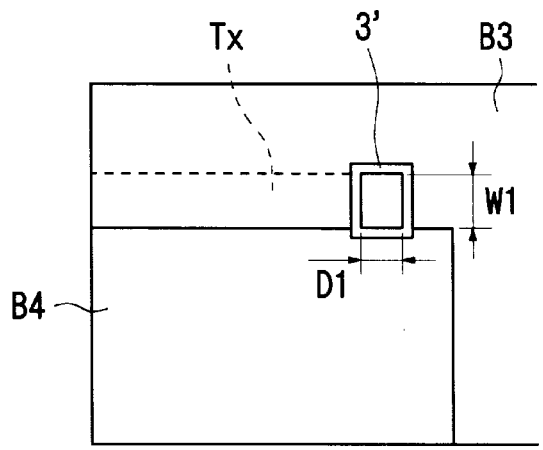

Although the embodiment of FIGS. 1 to 16 employs a pipe member of circular section as the fixed pipe 3, a pipe of a square section as shown in FIG. 17(a) may be used as a fixed pipe 3' in the case of feeding the prism-shaped or flat prism shaped chip components as shown in FIG. 2(b) or 2(c), respectively. In this instance, as the fixed pipe 3' use may be made of a square pipe member having inner dimensions corresponding to the inlet width W1 and depth D1 of the curved passage Tx or having inner dimensions smaller than those, as shown in FIG. 17(b). The movable pipe 4 may be comprised of a square pipe member or a circular pipe member having a square bore and a circular exterior.

Figure 18:
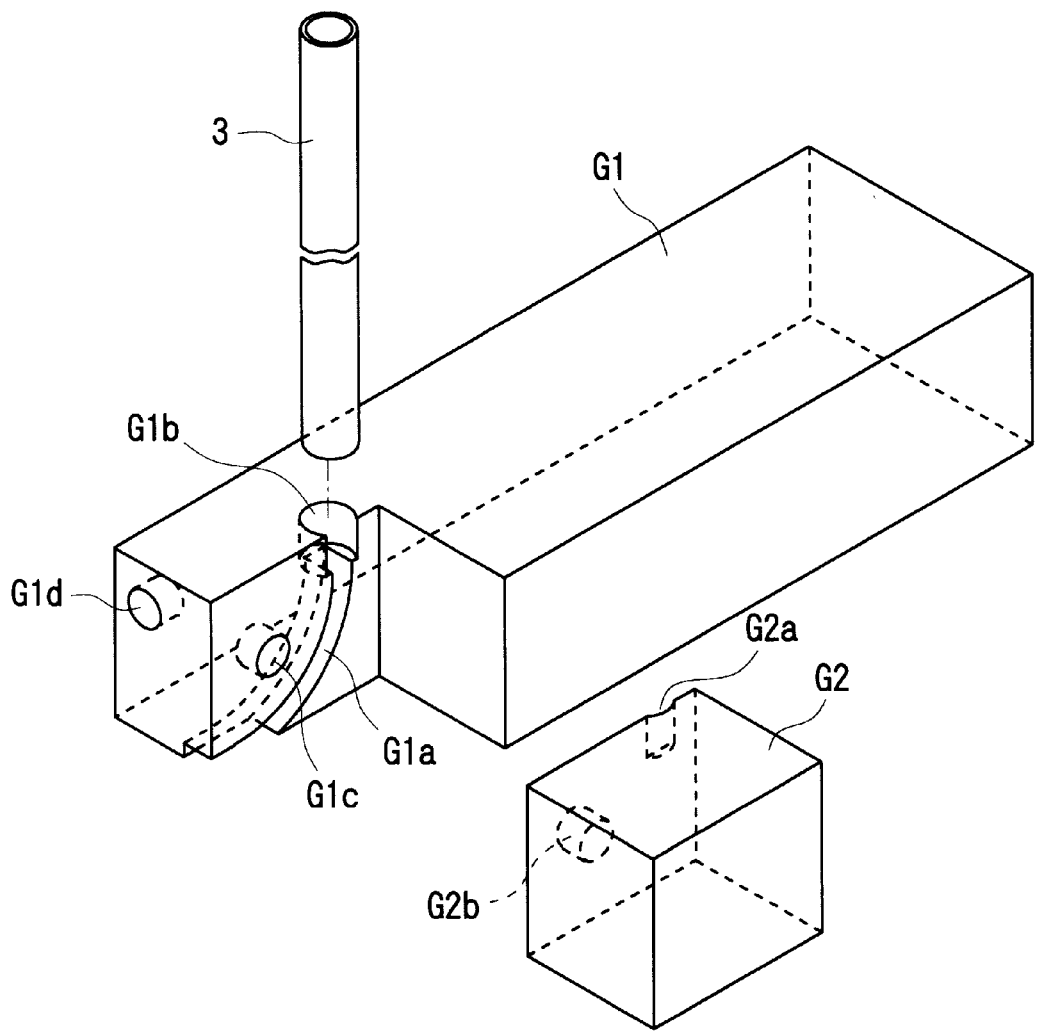
FIG. 18 is a perspective view of a block constituting the component guide, showing an embodiment in which the construction of the component guide is improved.

FIG. 18 illustrates an embodiment in which the construction of the component guide is improved. This embodiment differs in construction from the embodiment shown in FIGS. 1 to 16 in that the component guide consists of three blocks. It is to be noted that the block corresponding to the block B1 has the same construction and hence is omitted from the drawing. The other constructions are substantially the same as the embodiment shown in FIGS. 1 to 16 and are also omitted in this description.

Similar to the above block B3, a block G1 illustrated in FIG. 18 is notched in its front part at one side, the inner side surface of the notched portion being provided with a groove G1a equivalent to the groove B3a and with a recess G1b comprising an insertion hole for the fixed pipe 3. The front part of the block G1 is provided with holes G1c and G1d for registering with the other blocks. On the other hand, a block G2 has the same contour as the notched portion of the block G1. The side surface of the block G2 is formed with a recess G2a for constituting the pipe insertion hole in cooperation with the recess G1b of the block G1, and with a protrusion G2b for registering with the hole G1c of the block G1.

The block G2 is fitted into the notched portion of the block G1 to form a curved passage similar to the embodiment of FIGS. 1 to 16. The recesses G1b and G2a of the blocks G1 and G2 cooperate to form the insertion hole for the fixed pipe 3. The fixed pipe 3 inserted into the insertion hole is abutted at its lower end against the step on the top surface of the curved passage and is connected to the curved passage.

Figure 19:
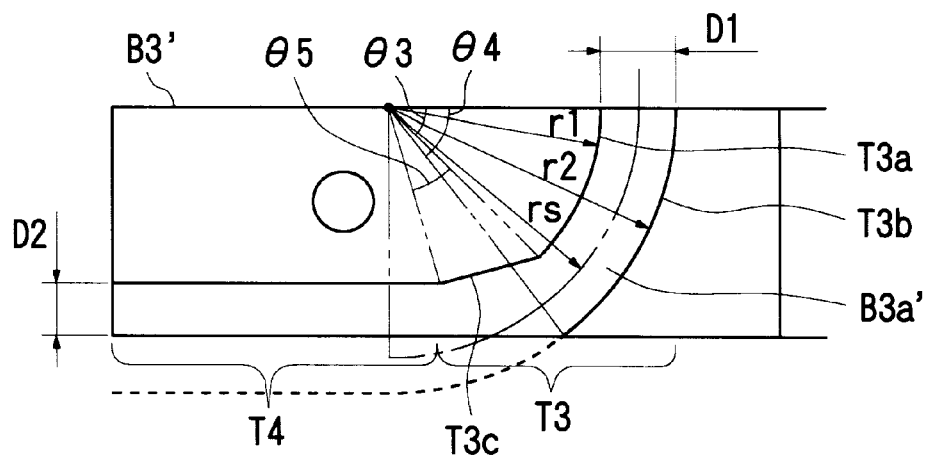
FIG. 19 is a side elevational view of a principal part of a block B3' showing an another embodiment in which the construction of the component guide is improved.

FIG. 19 illustrates an another embodiment in which the construction of the component guide is improved. This embodiment differs in construction from the embodiment shown in FIGS. 1 to 16 in that the groove of the block B3 has an improved configuration. The other constructions are substantially the same as the embodiment shown in FIGS. 1 to 16 and hence are not described herein.

Similar to the block B3, a block B3' shown in FIG. 19 has a front part notched on its one sides, the inner side surface of the notched portion being provided with a groove B3a' comprised of a combination of a curved groove T3 having at its center a predetermined radius of curvature rs and a linear groove T4 continuous with the curved groove T3.

The curved groove T3 includes a first curved surface T3a having a radius of curvature r1 smaller than the central curvature rs and having an angular range θ3 of about 45 degrees from its upper end, a second curved surface T3b having a radius of curvature r2 larger than the central curvature rs and having an angular range θ4 of about 52.5 degrees from the upper end, and an inclined surface T3c having an angle of inclination of about 75 degrees relative to the perpendicular and having an angular range θ5 of about 27.5 degrees from the lower end of the first curved surface T3a. Besides, the angular range θ5 is set so that an angle of the inclined surface T3c has an acute angle to the vertical passage or the transverse passage.

Within the angular range θ3, the curved groove T3 presents a certain section (a rectangular shape defined by the width W1 and the depth D1). On the other hand, the linear groove T4 has the same width W2 as that of the curved groove T3, but its depth D2 is smaller than the depth D1 of the curved groove T3. In other words, the groove B3a' of the block B3' has a configuration obtained by removing by a plane parallel to the linear groove T4 both the portion beyond the angular range θ4 of the curved groove T3 and the lower part of the linear groove T4 (dotted portion in FIG. 19). The curved groove T3 and the top surface of the linear groove T4 are continuous with each other by way of the inclined surface T3c.

Figure 20:
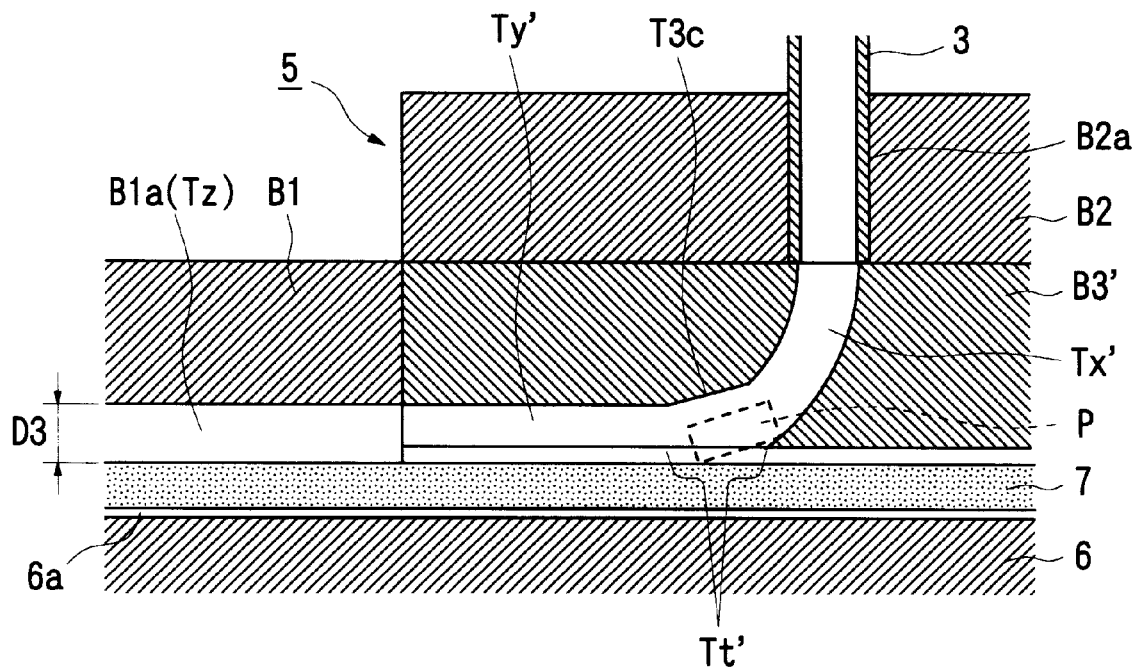
FIG. 20 is a longitudinal sectional view of a principal part of the component guide comprised of the block B3' shown in FIG. 19.

The block B3' shown in FIG. 19 is assembled with the other three blocks B1, B2 and B4 shown in FIGS. 1 to 16 into the component guide 5, of which side surface is fixedly secured to the frame 1. Referring to FIG. 20 illustrating the longitudinal section of its principal part, the bottom surface of the block B1 abuts against the surface of the belt 7 but the bottom surfaces of the blocks B3' and B4 are not abutted against the surface of the belt 7, to form a gap therebetween corresponding to the difference between the depths D3 and D2.

Thus, the curved groove T3 of the groove B3a' of the block B3' is closed at its side opening by the block B4, resulting in a curved passage Tx' having at its center a predetermined radius of curvature rs and having in the vicinity of the belt an opening Tt' for the discharge of the chip components. The linear groove T4 of the groove B3a' is closed at its side opening by the block B4 and is closed at its bottom opening by the belt 7, resulting in a linear passage Ty', whereas the linear groove B1a of the block B1 is closed at its bottom opening by the belt 7, resulting in a linear passage Tz. As is apparent from FIG. 20, the linear passages Ty' and Tz are continuous with each other in such a manner that their top surfaces are coincident with each other.

By virtue of use of the thus configured curved passage Tx', the inclined surface T3c located thereabove will suppress jumping which would otherwise occur when the chip components P traveling through the curved passage Tx' are discharged via the opening Tt' onto the belt 7 (see the dotted lines in FIG. 20), thereby preventing the posture of the chip components P discharged onto the belt 7 from being disturbed.

Due to the continuity of the curved passage Tx' with the linear passage Ty' via the inclined surface T3c, it would be possible to approximate the depths of the linear passages Ty' and Tz to the height of the chip component P rather than the component guide shown in FIGS. 1 to 16, thus reducing the clearance in the height direction between the linear passages Ty' and Tz and the chip components P to suppress a vertical rocking during the transport of the components.

Figure 21:
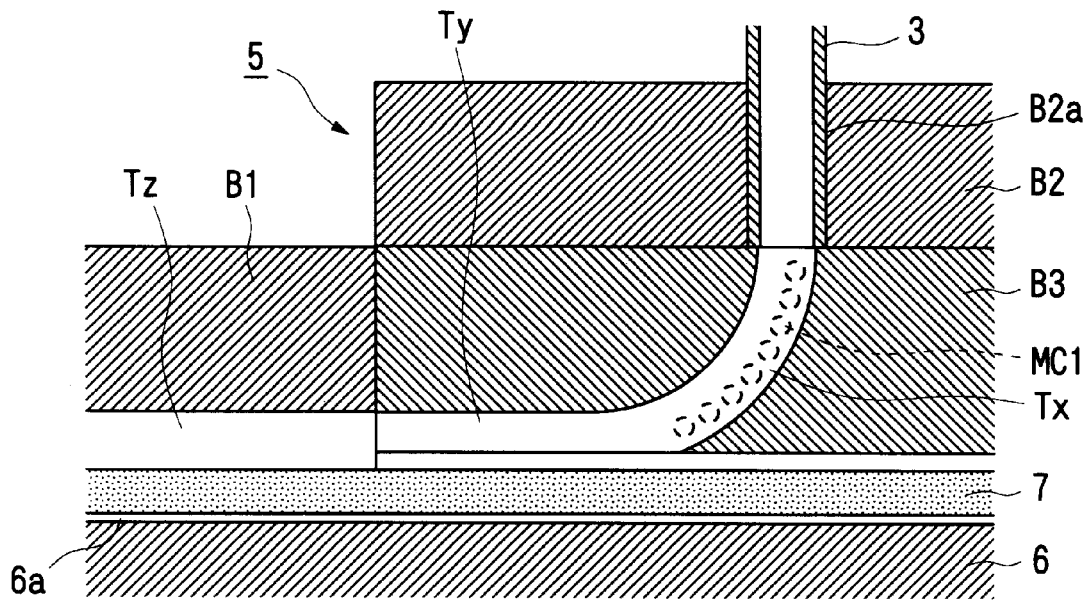
FIG. 21 is a longitudinal sectional view of a principal part of the component guide showing an embodiment in which a permanent magnet is arranged along the curved passage.
Figure 22:
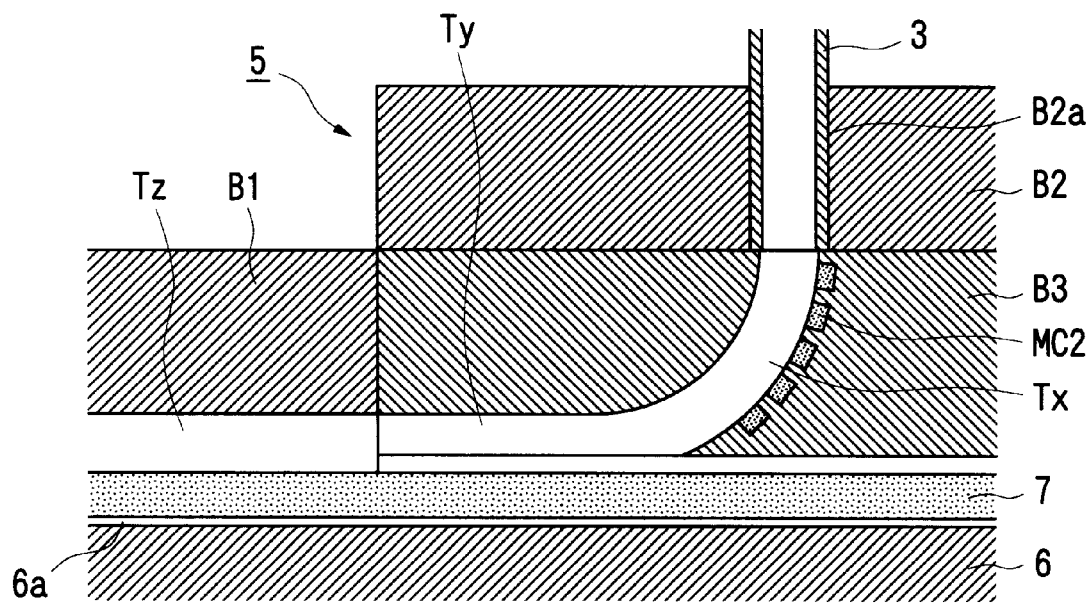
FIG. 22 is a longitudinal sectional view of a principal part of the component guide showing an another embodiment in which a permanent magnet is arranged along the curved passage.

FIGS. 21 and 22 illustrate two different embodiments each having permanent magnets arranged along the curved passage. These embodiments differ in construction from the embodiment shown in FIGS. 1 to 16 in that permanent magnets are arranged along the curved passage Tx for drawing the chip components P by the magnetic force toward the inner surface of the passage without interfering with the movement of the chip components P. The other constructions are substantially the same as those of the embodiment shown in FIGS. 1 to 16 and therefore are not described herein.

On one side surface or both sides surfaces constituting the curved passage Tx, FIG. 21 embodiment is provided with a plurality of small sized permanent magnets MCI (rare earth permanent magnets) equally spaced apart from one another along the curved passage Tx. The permanent magnets MC1 may be exposed to the curved passage Tx or may not be exposed to it. The polarities of the permanent magnets MC1 closer to the curved passage Tx are such that N-pole and S-pole alternate along the curved passage Tx.

On the rear side curved surface constituting the curved passage Tx, FIG. 22 embodiment is provided with a plurality of small sized permanent magnets MC2 (rare earth permanent magnets) equidistantly arranged along the curved passage Tx. The permanent magnets MC2 may or may not be exposed to the curved passage Tx. The polarities of the permanent magnets MC2 closer to the curved passage Tx are such that N-pole and S-pole alternate along the curved passage Tx.

The employment of such a structure will allow the magnetic force from the permanent magnets MC1 or MC2 to draw the chip components P traveling through the curved passage Tx toward the inner surface of the passage without impeding the passage thereof, to thereby stabilize the posture of the chip components P traveling through the curved passage Tx as well as the path of traveling, ensuring the smooth movement of the components through the curved passage Tx.

Figure 23:
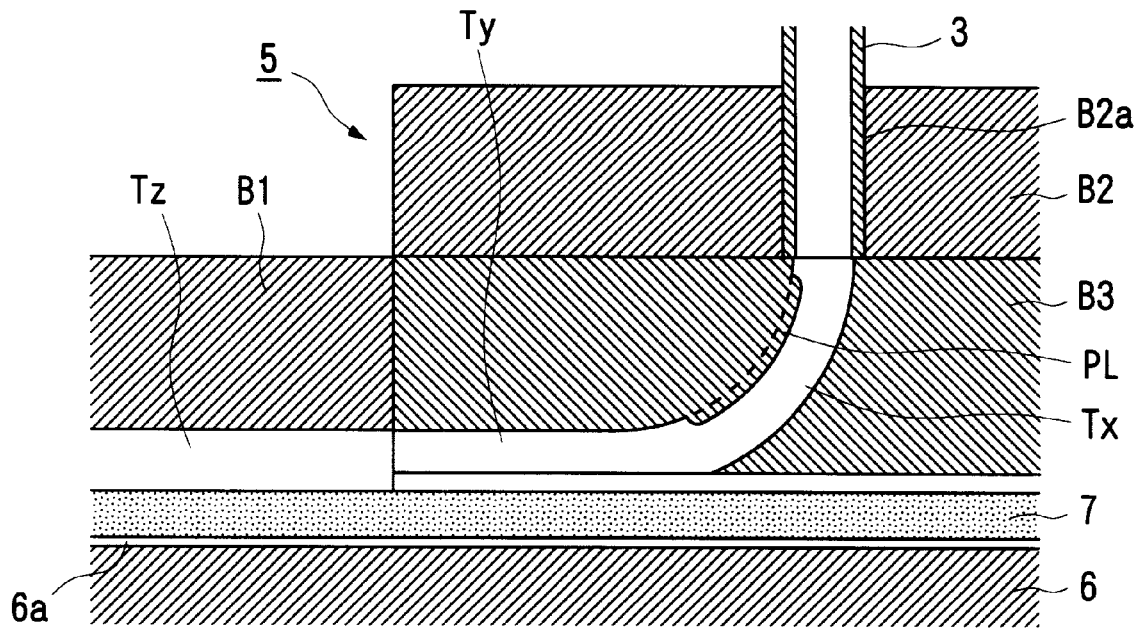
FIGS. 23(a) and 23(b) are a longitudinal sectional view of a component guide showing an embodiment in which a convexity is formed on the inner surface of the curved passage, and a cross sectional view of the curved passage, respectively.
Figure 23:
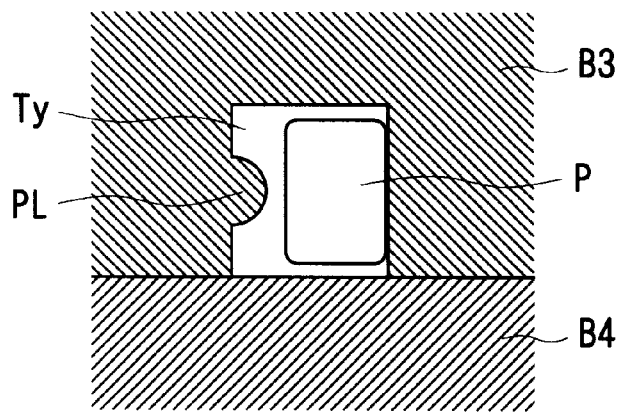

FIGS. 23(a) and 23(b) illustrate another embodiment of the present invention, which differs from the embodiment shown in FIGS. 1 to 16 in that the inner surface of the curved passage Tx is provided with a convexity PL for restricting the posture of the chip components P passing though the curved passage Tx. As shown in FIG. 23(b), the convexity PL has a cross section shape of a semi-circular or other similar curved surface shape, and is formed along the curved passage Tx at the center of the front curved surface constituting the curved passage Tx. The other structures are substantially the same as those of the embodiment shown in FIGS. 1 to 16, and hence the description thereof will be omitted.

Due to the employment of such a structure, the convexity PL will contribute to a restriction of the posture and the path of movement of the chip components P moving through the curved passage Tx, to ensure the smooth movement of the components through the curved passage Tx.

Although in the above embodiments the grooves B3a (B3a') and G1a of the blocks B3 (B3') and G1, respectively, are shown including the linear grooves, the blocks B3 (B3') and G1 may be replaced by any blocks having only the curved grooves which are obtained by excluding the linear grooves from the grooves B3a (B3a') and G1a.

Furthermore, by forming from ceramics such as alumina porcelain the block B3 (B3') or block G1, which is the block having at least a groove of the two blocks constituting the curved passages Tx, Tx', namely, the blocks B3 (B3') and B4 or the blocks G1 and G2, the curved passages Tx and Tx' will be able to obtain higher wear resistant properties compared with the blocks made of resin or metal, while simultaneously preventing any variance in passage dimensions from occurring even under high temperature and high humidity environment, to provide an improved stability to the change of posture and to the discharge of components.

Moreover, the above embodiments employ a belt to close the underside of the linear groove to form a linear transverse passage for the transport of chip components, the underside of the linear groove may be closed by any fixed part other than the belt to make the similar transverse passage. To perform the transport of the chip components through the passage, in this instance, air may be blown in from the rear side of the transverse passage or alternatively, air may be sucked in from the front side of the transverse passage.

What is claimed is:

1. A chip component feeding apparatus having an accommodation chamber for accommodating chip components in bulk, a vertical passage through which said chip components are taken in one by one and are enabled to move by their own weight, and a transverse passage through which said chip components discharged from said vertical passage are transported in a predetermined direction, comprising:

a curved passage defined by a first block and a second block, said first block having a curved groove forming said curved passage and said second block closing a side opening of said curved groove, said curved passage disposed between said vertical passage and said transverse passage for changing the posture of said chip components discharged from said vertical passage onto said transverse passage so as to conform to said transverse passage, wherein said curved passage having at its passage center a predetermined radius of curvature and being provided with an opening for the discharge of chip components in the vicinity of said transverse passages;

and wherein said curved groove includes a first curved surface and a second curved surface, said first curved surface has a predetermined radius of curvature and said second curved surface has a center of curvature coincident with that of the first curved surface and a radius of curvature larger than that of the first curved surface and a range of angle of the second curved surface from its upper end is less than 90 degrees to allow the opening for discharging one of the chip components to be formed at a lower end of the curved passage.

2. A chip component feeding apparatus according to claim 1, wherein:

a range of angle of said first curved surface from its upper end is larger than the range of angle of said second curved surface from its upper end.

3. A chip component feeding apparatus according to claim 1, wherein:

a range of angle of said first curved surface from its upper end is smaller than the range of angle of said second curved surface from its upper end, and said first curved surface is provided at its lower end with an inclined surface which is continuous therewith at an acute angle to the vertical passage.

4. A chip component feeding apparatus according to claim 1, wherein said first block has a curved groove and is made of ceramics.

5. A chip component feeding apparatus according to claim 1, further comprising:

a permanent magnet arranged along said curved passage for drawing said chip components moving through said curved passage by its magnetic force toward the inner surface of said curved passage without interfering with the movement of said chip components.

6. A chip component feeding apparatus according to claim 5, wherein:

said permanent magnet comprises small magnets.

7. A chip component feeding apparatus according to claim 1, wherein:

said inner surface of said curved passage is provided with a convexity for restricting the posture of said chip components passing through said curved passage.

8. A chip component feeding apparatus according to claim 7, wherein:

the cross section shape of said convexity is of a semicircular shape or of a curved surface shape analogous to this.

9. The chip component feeding apparatus of claim 1 wherein the curved passage has a smooth upper wall portion with a continuous curvature between a first side wall portion of the vertical passage and an upper portion of the transverse passage and a smooth lower wall portion with a continuous curvature between a second side wall portion of the vertical passage and a point above a bottom wall portion of the transverse passage, the chip components encountering the point before they encounter the upper wall portion of the transverse passage, the transverse passage including a lower wall portion, the point and the lower wall portion of the transverse passage being arranged so the chip components fall from the point to the lower wall portion of the transverse passage prior to entering the portion of the transverse passage including the upper wall portion, the first and second wall portions being generally diametrically opposed to each other.

10. The chip component feeding apparatus of claim 9 wherein the chip components have a predetermined cross section, the curved passage having a cross section throughout its length that is geometrically similar to the predetermined cross section.

11. The chip component feeding apparatus of claim 1 wherein the curved passage has a smooth upper wall portion with a continuous curvature between a first side wall portion of the vertical passage and an upper portion of the transverse passage and a smooth lower wall portion with a continuous curvature between a second side wall portion of the vertical passage and a point above a bottom wall portion of the transverse passage, the chip components encountering the point before they encounter the upper wall portion of the transverse passage, the transverse passage including a lower wall portion, the point and the lower wall portion of the transverse passage being arranged so the chip components fall from the point to the lower wall portion of the transverse passage prior to entering the portion of the transverse passage including the upper wall portion, the first and second wall portions being generally diametrically opposed to each other.

12. The chip component feeding apparatus of claim 11 wherein the chip components have a predetermined cross section, the curved passage having a cross section throughout its length that is geometrically similar to the predetermined cross section.

* * * * *